United States Patent
Chang et al.

(10) Patent No.: US 12,218,283 B2
(45) Date of Patent: Feb. 4, 2025

(54) ARRAY SUBSTRATE AND DISPLAY DEVICE

(71) Applicant: TCL CHINA STAR OPTOELECTRONICS TECHNOLOGY CO., LTD., Shenzhen (CN)

(72) Inventors: Tsunglung Chang, Shenzhen (CN); Aoqi Song, Shenzhen (CN); Ting Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 606 days.

(21) Appl. No.: 17/057,076

(22) PCT Filed: Jun. 16, 2020

(86) PCT No.: PCT/CN2020/096285
§ 371 (c)(1),
(2) Date: Nov. 19, 2020

(87) PCT Pub. No.: WO2021/203552
PCT Pub. Date: Oct. 14, 2021

(65) Prior Publication Data
US 2022/0190206 A1    Jun. 16, 2022

(30) Foreign Application Priority Data
Apr. 9, 2020 (CN) .......................... 202010275257.3

(51) Int. Cl.
*H01L 33/44* (2010.01)
*H01L 25/075* (2006.01)

(52) U.S. Cl.
CPC .......... *H01L 33/44* (2013.01); *H01L 25/0753* (2013.01)

(58) Field of Classification Search
CPC ... H01L 33/44; H01L 25/0753; H01L 25/167; H01L 33/60; H01L 27/1248; G02F 1/133603
See application file for complete search history.

(56) References Cited

U.S. PATENT DOCUMENTS

| | | | |
|---|---|---|---|
| 2010/0136775 A1* | 6/2010 | Choi | H01L 27/1225 438/585 |
| 2011/0140090 A1 | 6/2011 | Jeong et al. | |

(Continued)

FOREIGN PATENT DOCUMENTS

| | | |
|---|---|---|
| CN | 101911313 A | 12/2010 |
| CN | 103715276 A | 4/2014 |

(Continued)

OTHER PUBLICATIONS

International Search Report in International application No. PCT/CN2020/096285, mailed on Jan. 11, 2021.

(Continued)

*Primary Examiner* — Su C Kim
(74) *Attorney, Agent, or Firm* — PV IP PC; Wei Te Chung

(57) ABSTRACT

An array substrate and a display panel are provided, the array substrate is disposed on the base substrate, and a passivation layer is formed on a side of the array substrate layer away from the base substrate. The passivation layer includes a first dielectric layer, a second dielectric layer, and a third dielectric layer stacked in sequence, the first dielectric layer is disposed close to the array layer and the third dielectric layer is disposed away from the array layer, a refractive index of the first dielectric layer is different from a refractive index of the second dielectric layer, and the refractive index of the second dielectric layer is different from a refractive index of the third dielectric layer.

16 Claims, 2 Drawing Sheets

(56) References Cited

U.S. PATENT DOCUMENTS

2017/0069681 A1* 3/2017 Lee .................. H01L 33/62
2018/0158987 A1* 6/2018 Lee .................. H01L 33/32

FOREIGN PATENT DOCUMENTS

| CN | 104299978 A | 1/2015 |
| CN | 108183156 A | 6/2018 |
| JP | 2016058586 A | 4/2016 |

OTHER PUBLICATIONS

Written Opinion of the International Searching Authority in International application No. PCT/CN2020/096285, mailed on Jan. 11, 2021.

* cited by examiner

ARRAY SUBSTRATE AND DISPLAY DEVICE

RELATED APPLICATIONS

This application is a Notional Phase of PCT Patent Application No. PCT/CN2020/096285 having international filing date of Jun. 16, 2020, which claims the benefit of priority of Chinese Patent Application No. 202010275257.3 filed on Apr. 9, 2020. The contents of the above applications are all incorporated by reference as if fully set forth herein in their entirety.

BACKGROUND OF INVENTION

Field of Invention

The present application relates to the field of display technology, and particularly to an array substrate and a display device

Description of Prior Art

In prior art, white oil is coated on backlight modules composed of sub-millimeter light-emitting diodes (mini-LEDs) to reflect light emitted by the mini-LEDs, and can also play a role in preventing scratches. However, coating the white oil is a separate process and increases the manufacturing cost of the backlight module. Therefore, it is necessary to propose a technical solution on how to manufacture the reflective layer while reducing manufacturing cost.

SUMMARY OF INVENTION

The purpose of the present application is providing an array substrate and a display device to solve the problem of using the white oil as the reflective layer, that is a separate process to cause high manufacturing cost.

To solve the above problem, the present application provides an array substrate, including a base substrate, an array layer, a passivation layer and a plurality of light-emitting components, the array layer is disposed on the base substrate, the light-emitting components are disposed on the array layer; and the passivation layer is formed on a side of the array layer away from the base substrate, the passivation layer comprises a first dielectric layer, a second dielectric layer and a third dielectric layer stacked in sequence, the first dielectric layer is disposed close to the array layer, the third dielectric layer is disposed away from the array layer, a refractive index of the first dielectric layer is different from a refractive index of the second dielectric layer, and the refractive index of the second dielectric layer is different from a refractive index of the third dielectric layer.

The array substrate of the present application, wherein the refractive index of the second dielectric layer is greater than the refractive index of the first dielectric layer and the refractive index of the third dielectric layer.

The array substrate of the present application, wherein a difference between the refractive index of the second dielectric layer and the refractive index of the first dielectric layer is greater than or equal to 1 and is less than or equal to 3, and a difference between the refractive index of the second dielectric layer and the refractive index of the third dielectric layer is greater than or equal to 1 and is less than or equal to 3.

The array substrate of the present application, wherein the first dielectric layer and the third dielectric layer are silicon nitride layers, the second dielectric layer is an amorphous silicon layer, a thickness of the first dielectric layer is 640-660 angstroms, a thickness of the second dielectric layer is 160-180 angstroms, and a thickness of the third dielectric layer is 600-1200 angstroms.

The array substrate of the present application, wherein the passivation layer further comprises a fourth dielectric layer, the fourth dielectric layer is formed on a side of the third dielectric layer away from the array layer, a difference between a refractive index of the fourth dielectric layer and the refractive index of the third dielectric layer is greater than the difference between the refractive index of the second dielectric layer and the refractive index of the first dielectric layer.

The array substrate of the present application, wherein the first dielectric layer is a silicon nitride layer, the third dielectric layer is a silicon oxide layer, the second dielectric layer and the fourth dielectric layer are amorphous silicon layers, a thickness of the first dielectric layer is 2400-2500 angstroms, a thickness of the second dielectric layer is 235-255 angstroms, a thickness of the third dielectric layer is 1050-1080 angstroms, and a thickness of the fourth dielectric layer is 190-220 angstroms.

The array substrate of the present application, wherein the array substrate further comprises an indium tin oxide layer, the indium tin oxide layer is disposed on a side of the passivation layer away from the array layer, and a thickness of the indium tin oxide layer is 480-520 angstroms.

The array substrate of the present application, wherein the passivation layer comprises a through hole, the through hole is defined and surrounded by an inner surface having a slope angle of 18°-87°.

The array substrate of the present application, wherein the light-emitting components are submillimeter light-emitting diodes or miniature light-emitting diodes.

A display device, wherein the display device comprises an array substrate, the array substrate comprises a base substrate, an array layer, a passivation layer and a plurality of light-emitting components;

the array layer is disposed on the base substrate, the light-emitting components are disposed on the array layer;

the passivation layer is formed on a side of the array layer away from the base substrate, the passivation layer comprises a first dielectric layer, a second dielectric layer and a third dielectric layer stacked in sequence, the first dielectric layer is disposed close to the array layer, the third dielectric layer is disposed away from the array layer, a refractive index of the first dielectric layer is different from a refractive index of the second dielectric layer, and the refractive index of the second dielectric layer is different from a refractive index of the third dielectric layer.

The display device of the present application, wherein the refractive index of the second dielectric layer is greater than the refractive index of the first dielectric layer and the refractive index of the third dielectric layer.

The display device of the present application, wherein a difference between the refractive index of the second dielectric layer and the refractive index of the first dielectric layer is greater than or equal to 1 and is less than or equal to 3, a difference between the refractive index of the second dielectric layer and the refractive index of the third dielectric layer is greater than or equal to 1 and is less than or equal to 3.

The display device of the present application, wherein the first dielectric layer and the third dielectric layer are silicon nitride layers, the second dielectric layer is an amorphous silicon layer, a thickness of the first dielectric layer is 640-660 angstroms, a thickness of the second dielectric layer is 160-180 angstroms, a thickness of the third dielectric layer is 600-1200 angstroms.

The display device of the present application, wherein the passivation layer further comprises a fourth dielectric layer, the fourth dielectric layer is formed on a side of the third dielectric layer away from the array layer, a difference between a refractive index of the fourth dielectric layer and the refractive index of the third dielectric layer is greater than the difference between the refractive index of the second dielectric layer and the refractive index of the first dielectric layer.

The display device of the present application, wherein the first dielectric layer is a silicon nitride layer, the third dielectric layer is a silicon oxide layer, the second dielectric layer and the fourth dielectric layer are amorphous silicon layers, a thickness of the first dielectric layer is 2400-2500 angstroms, a thickness of the second dielectric layer is 235-255 angstroms, a thickness of the third dielectric layer is 1050-1080 angstroms, a thickness of the fourth dielectric layer is 190-220 angstroms.

The display device of the present application, wherein the array substrate further comprises an indium tin oxide layer, the indium tin oxide layer is disposed on a side of the passivation layer away from the array layer, a thickness of the indium tin oxide layer is 480-520 angstroms.

The display device of the present application, wherein the passivation layer comprises a through hole, the through hole is defined and surrounded by an inner surface, a slope angle of the inner surface is 18°-87°.

The benefit of the present application is: the present application provides an array substrate and a display panel, the array substrate includes a base substrate, an array layer, a passivation layer and a plurality of light-emitting components, the array layer is disposed on the base substrate, the light-emitting components are disposed on the array layer the passivation layer is formed on a side of the array layer away from the base substrate, the passivation layer includes a first dielectric layer, a second dielectric layer and a third dielectric layer stacked in sequence, the first dielectric layer is disposed close to the array layer, the third dielectric layer is disposed away from the array layer, a refractive index of the first dielectric layer is different from a refractive index of the second dielectric layer, and the refractive index of the second dielectric layer is different from a refractive index of the third dielectric layer. The role of the passivation layer of the present application is refracting, compared with coating white ink as a separate process, that is, saving the manufacturing cost of the array substrate and improving the yield of the array substrate. Comparing with the traditional reflective layer composed of two dielectric layers with different refractive indexes, the passivation layer of the present application reflects the light with a wavelength of 450 nanometers and the reflectivity of the light with a wavelength of 450 nanometers is as high as 88% with an appropriate thickness.

DETAILED DESCRIPTION OF PREFERRED EMBODIMENTS

The technical solutions in the embodiments of the present application will be described clearly and completely below with reference to the drawings in the embodiments of the present application. Obviously, the described embodiments are only a part of the embodiments of the present application, not all the embodiments. Based on The embodiments in this application, all other embodiments obtained by those skilled in the art without making creative work, fall within the scope of protection of this application.

Figure 1:
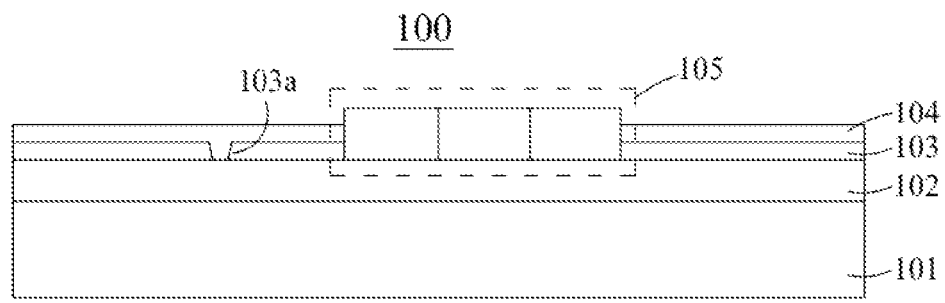
FIG. 1 is a schematic view of a backlight module of one embodiment of the present application.

Referring to FIG. 1, FIG. 1 is a schematic view of a backlight module of an embodiment of the present application. A blacklight module 100 includes an array substrate, the array substrate includes a base substrate 101, an array layer 102, a passivation layer 103, light-emitting components 105, and an indium tin oxide layer 104.

The base substrate 101 is a glass substrate, and the array layer 102 is disposed on the base substrate 101. The array layer 102 includes a plurality of thin film transistors (not shown in the drawing) arranged in an array. The thin film transistors can be back-etched channel thin film transistors or etch-block thin film transistors. The array layer 102 further includes conductive electrodes. Each of the light-emitting elements 105 is connected to two conductive electrodes disposed in the array layer 102 through conductive glue or solder, and one of the conductive electrodes is connected to the drain electrode of the thin film transistor. The light-emitting component 105 is a sub-millimeter light-emitting diode (mini-LED). Each light-emitting component 105 includes a red mini-LED, a blue mini-LED, and a green mini-LED.

The passivation layer 103 is formed on a side of the array layer 102 away from the base substrate 101, the passivation layer 103 includes a first dielectric layer, a second dielectric layer and a third dielectric layer stacked in sequence, the first dielectric layer is disposed close to the array layer 102, the third dielectric layer is disposed away from the array layer 102. A refractive index of the first dielectric layer is different from a refractive index of the second dielectric layer, and the refractive index of the second dielectric layer is different from a refractive index of the third dielectric layer. A difference between the respective refractive indexes of the first dielectric layer and the second dielectric layer plays a role in reflecting light, and compliments a difference between the respective refractive indexes of the second dielectric layer and the third dielectric layer to realize reflection.

The passivation layer includes the first dielectric layer, the second dielectric layer, and the third dielectric layer stacked in sequence of the present application; the refractive index of the first dielectric layer is different from the refractive index of the second dielectric layer and the refractive index of the second dielectric layer is different from the refractive index of the third dielectric layer, together this causes the passivation layer to reflect light. The passivation layer is manufactures the backlight module in a single-process, compared to traditional white ink coating, wherein a separate process is employed to adjust the structure and quality of the passivation layer to achieve reflection and scratch resistance effects of the white ink reflection standard. Based on a number of experiments, the inventors have found that when the traditional passivation layer is a silicon nitride layer and a silicon oxide film layer stacked on the array layer, the maximum reflectivity of the light at 450 nm is 68%, which is not comparable to that of white ink, wherein the present application adopts a passivation layer with three film layers, and the reflectivity is comparable to that of white ink.

In some embodiments, the refractive index of the second dielectric layer is greater than the refractive index of the first dielectric layer and the refractive index of the third dielectric layer. The incidence of light from the second dielectric layer to the first dielectric layer is from an optically denser medium to an optically sparse medium, so that the possibility of the reflection between the first dielectric layer and second dielectric layer is increased. The refractive index of the first dielectric layer is greater than or equal to the refractive index of the third dielectric layer.

In some embodiments, a difference between the refractive index of the second dielectric layer and the refractive index of the first dielectric layer is greater than or equal to 1, is less than or equal to 3, and a difference between the refractive index of the second dielectric layer and the refractive index of the third dielectric layer is greater than or equal to 1 and is less than or equal to 3. For example, the difference between the refractive index of the second dielectric layer and the refractive index of the first dielectric layer is 1.2, 1.5, 1.8, 2.0, 2.4 and 2.8, the difference between the refractive index of the second dielectric layer and the refractive index of the third dielectric layer is 1.2, 1.5, 1.8, 2.0, 2.2, 2.4 and 2.8.

In some embodiments, a difference between the refractive index of the second dielectric layer and the refractive index of the third dielectric layer is greater than a difference between the refractive index of the second dielectric layer and the refractive index of the first dielectric layer.

Specifically, the first dielectric layer and the third dielectric layer are silicon nitride layers, the second dielectric layer is an amorphous silicon layer, a thickness of the first dielectric layer is 640-660 angstroms, a thickness of the second dielectric layer is 160-180 angstroms, and a thickness of the third dielectric layer is 600-1200 angstroms. The refractive index of the first dielectric layer, the second dielectric layer, and the third dielectric layer are matched to achieve reflection, and an appropriate thickness is selected to achieve selective reflection with a wavelength of 440 nanometers to 460 nanometers.

In some embodiments, the passivation layer further includes a fourth dielectric layer, the fourth dielectric layer is formed on a side of the third dielectric layer away from the array layer; a difference between a refractive index of the fourth dielectric layer and the refractive index of the third dielectric layer is greater than the difference between the refractive index of the second dielectric layer and the refractive index of the first dielectric layer, to further increase light reflectivity.

Specifically, the first dielectric layer is a silicon nitride layer, the third dielectric layer is a silicon oxide layer, the second dielectric layer and the fourth dielectric layer is amorphous silicon layer, a thickness of the first dielectric layer is 2400-2500 angstroms, a thickness of the second dielectric layer is 235-255 angstroms, a thickness of the third dielectric layer is 1050-1080 angstroms, and a thickness of the fourth dielectric layer is 190-220 angstroms. The refractive index of the silicon nitride layer is 1.88, the refractive index of the silicon oxide layer is 1.4, and the refractive index of the amorphous silicon layer is 3.0-4.0.

The indium tin oxide layer 104 is disposed on a side of the passivation layer 103 away from the array layer 102, and a thickness of the indium tin oxide layer 104 is 480-520 angstroms. On one hand, the indium tin oxide layer can be employed to bind a chip, and on the other hand, by selecting an appropriate thickness, compliments the passivation layer 103 in realizing light reflection.

Referring to FIG. 1, the passivation layer includes a through hole. The through hole is defined and surrounded by an inner surface 103a having a slope angle of 18°-87°. For example, the slope angle is 20°, 30°, 40° and 65°. Comparing the traditional passivation layer as a single layer with the passivation layer 103 composed of different film layers to achieve reflection, as the passivation layer 103 is etched to form a through hole, as the passivation layer is composed of different film layers, a different etching rate of different film layers will cause the taper angle to be too large, causing the indium tin oxide layer 104 to form a discontinuous film layer in the through hole, resulting in a reduction in the bonding yield of the chip connected to the indium tin oxide layer 104, and also resulting an undercut (gate insulation layer over-etching) phenomenon appearing in the gate insulation layer disposed in the array layer 102. The slope angle of the inner surface 103a is 18°-87° and is achieved by optimizing the etching process of the passivation layer 103, or by optimizing the film composition of the passivation layer 103.

The present application also provides a display device, the display device includes a display panel and the backlight module of the above, or the display device includes the display panel, the display panel includes the array substrate; the difference is, as the display panel includes the array substrate, the light-emitting component 105 is a miniature light-emitting diode.

The above scheme is described in detail below in conjunction with specific and comparative embodiments.

First Embodiment

Figure 2:
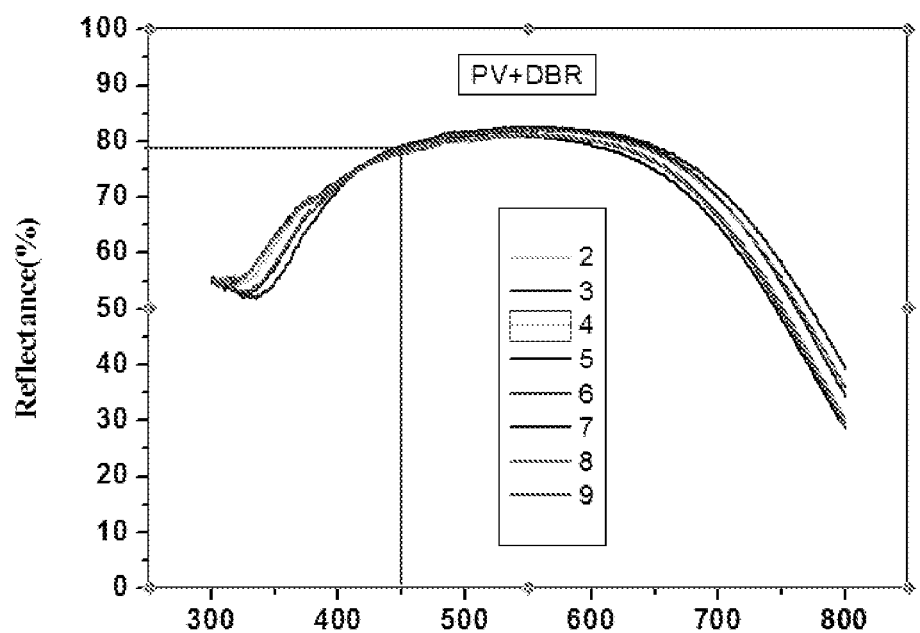
FIG. 2 is a schematic view of the reflectivity of a passivation layer of the backlight module for light of different wavelengths of a first embodiment of the present application.

The present application provides the backlight module, the backlight module includes the array substrate and the passivation layer, the array substrate includes the base substrate, the array layer and the plurality of mini-LEDs. The array layer is disposed on the base substrate. The mini-LEDs are disposed on the array layer. The passivation layer is formed on the array layer. The passivation layer includes a silicon nitride layer (thickness is 2400 angstroms), an amorphous silicon layer (thickness is 240 angstroms), a silicon oxide layer (thickness is 1080 angstroms) and an amorphous silicon layer (thickness is 210 angstroms) disposed and stacked in sequence on the array layer. A reflectivity of the passivation layer is 78.6%, for light with a wavelength of 450 nm, and the reflectivity with different wavelengths of the passivation layer is shown in FIG. 2.

Second Embodiment

The present application provides a backlight module, the backlight module of the present embodiment is basically similar to the backlight module of the first embodiment, except that the passivation layer includes a silicon nitride layer (thickness is 2420 angstroms), an amorphous silicon layer (thickness is 250 angstroms), a silicon oxide layer (thickness is 1060 angstroms), an amorphous silicon layer (thickness is 200 angstroms) and a silicon oxide layer (thickness is 760 angstroms) disposed in sequence on the array layer. The backlight module further includes an indium tin oxide layer (thickness is 500 angstroms) disposed on one side of the passivation layer away from the array layer. A reflectivity of the reflective layer composed of the passivation layer and the indium tin oxide layer is 88%, for light with a wavelength of 450 nm.

Third Embodiment

Figure 3:
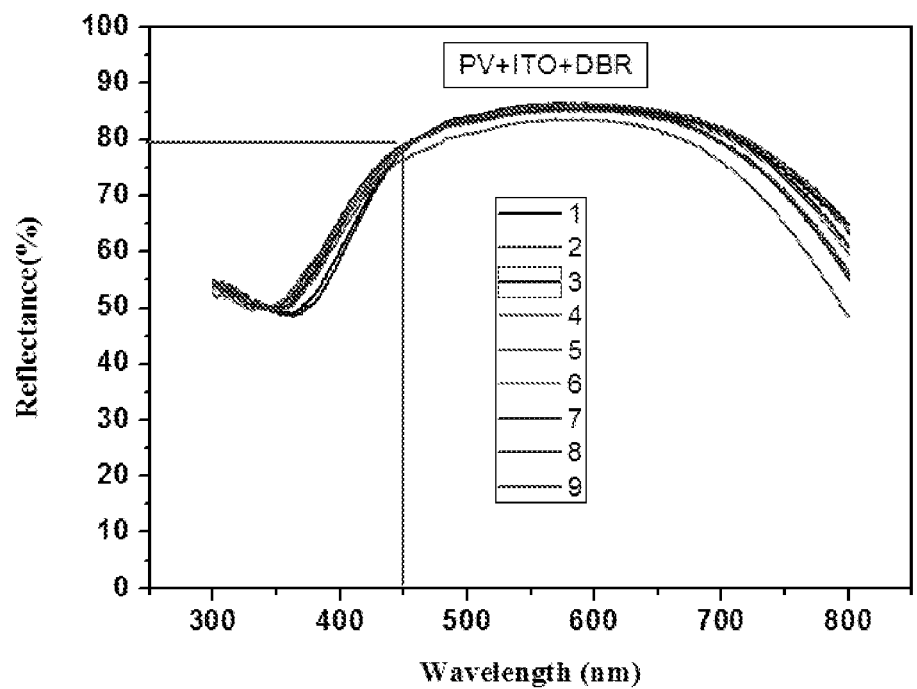
FIG. 3 is a schematic view of the reflectivity of a passivation layer of the backlight module for light of different wavelengths of a third embodiment of the present application.

The present application provides a backlight module, the backlight module of the present embodiment is basically similar to the backlight module of the first embodiment, except that the passivation layer includes a silicon nitride layer (thickness is 2400 angstroms), an indium tin oxide layer (thickness is 500 angstroms), a silicon oxide layer (thickness is 750 angstroms), an amorphous silicon layer (thickness is 250 angstroms), a silicon oxide layer (thickness is 1050 angstroms), and an amorphous silicon layer (thickness is 196 angstroms) disposed in sequence on the array layer. The backlight module further includes an indium tin oxide layer (thickness is 500 angstroms) disposed on one side of the passivation layer away from the array layer. A reflectivity of the passivation layer is 78.6%, for light with a wavelength of 450 nm, and the reflectivity with different wavelengths of the passivation layer is shown in FIG. 3.

Fourth Embodiment

The present application provides a backlight module, the backlight module of the present embodiment is basically similar to the backlight module of the first embodiment, except that the passivation layer includes a silicon nitride layer (thickness is 658 angstroms), an amorphous silicon layer (thickness is 170 angstroms) and a silicon nitride layer (thickness is 1200 angstroms) disposed in sequence on the array layer. A reflectivity of the passivation layer and the indium tin oxide layer is 79%, for light with a wavelength of 450 nm.

Fifth Embodiment

Figure 4:
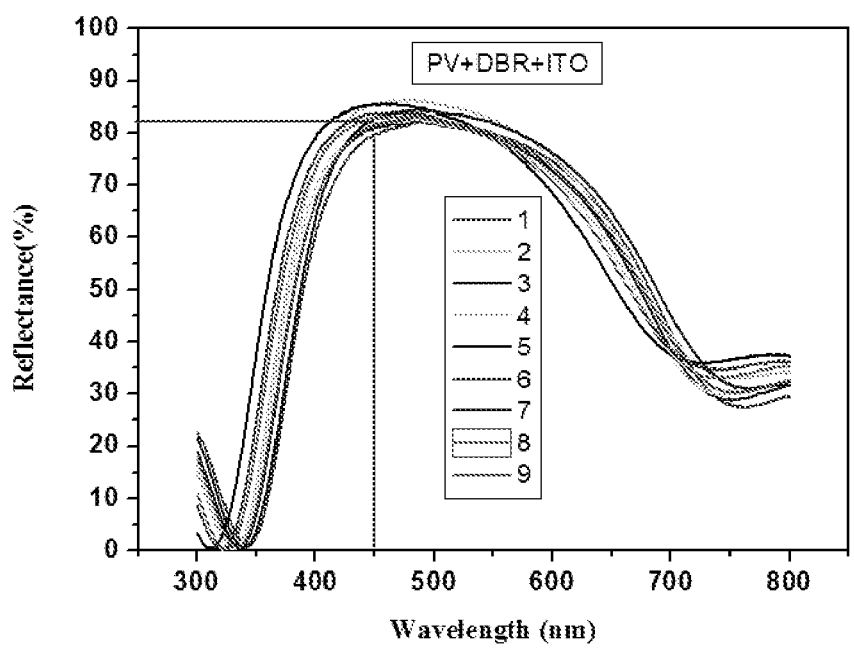
FIG. 4 is a schematic view of the reflectivity of a reflective layer composed of a passivation layer and an indium tin oxide layer in the backlight module for light of different wavelengths of a fifth embodiment of the present application.

The present application provides a backlight module, the backlight module of the present embodiment is basically similar to the backlight module of the first embodiment, except that the passivation layer includes a silicon nitride layer (thickness is 650 angstroms), an amorphous silicon layer (thickness is 178 angstroms) and a silicon nitride layer (thickness is 600 angstroms) disposed in sequence on the array layer. The backlight module further includes an indium tin oxide layer (thickness is 500 angstroms) disposed on the passivation layer away from one side of the array layer. A reflectivity of the passivation layer and the indium tin oxide layer is 83.8%, for light with a wavelength of 450 nm. A reflectivity of reflection layer composed of the passivation layer and the indium tin oxide layer of the present embodiment to different wavelengths is shown in FIG. 4.

First Comparative Embodiment

The present application provides a backlight module, the backlight module of the present embodiment is basically similar to the backlight module of the first embodiment, except that the passivation layer includes a silicon nitride layer (thickness is 950 angstroms) and a silicon oxide layer (thickness is 1500 angstroms) disposed in sequence on the array layer. A reflectivity of the passivation layer is 68%, for light with a wavelength of 450 nm.

The embodiment of the first to the fifth, as the passivation layers of the embodiments of the present application composed of three or more dielectric layers and selected an appropriate thickness, a reflectivity is greater than or equal to 78.6%, that is the light with a wavelength of 450 nm. As the passivation layer is two different refractive index film layers, a reflectivity of the passivation layer is 68%, for light with a wavelength of 450 nm. As the passivation layer is two different refractive index film layers, a reflectivity of the passivation layer with two different refractive index film layers is less than a reflectivity of the passivation layer with three dielectric layers, for light with a wavelength of 450 nanometers. As known from the first embodiment, the second embodiment and the third embodiment, that is, an appropriate thickness and placement of the indium tin oxide layer can significantly increase the refractive index of the reflective layer composed of the passivation layer and the indium tin oxide layer.

The descriptions of the above embodiments are only used to help understand the technical solutions and core ideas of this application; those of ordinary skill in the art should understand that they can still modify the technical solutions described in the foregoing embodiments, or part of the technologies Features are equivalently replaced; and these modifications or replacements do not deviate the essence of the corresponding technical solutions from the scope of the technical solutions of the embodiments of the present application.

What is claimed is:

1. An array substrate, comprising a base substrate, an array layer, a passivation layer, and light-emitting components;
   wherein the array layer is disposed over the base substrate and comprises a plurality of thin film transistors arranged in an array, the light-emitting components are disposed on one side of the array layer facing away from the base substrate; and
   the passivation layer is disposed on the side of the array layer facing away from the base substrate, all portions of the passivation layer are arranged around lateral sides of the light-emitting components, and there is no part of the passivation layer over or below the light-emitting components, so that the passivation layer is reused as a reflective layer to directly reflect lateral light emitted from the light-emitting components, the passivation layer comprises a first dielectric layer, a second dielectric layer and a third dielectric layer stacked in sequence, the first dielectric layer is disposed close to the array layer, the third dielectric layer is disposed away from the array layer, a refractive index of the first dielectric layer is different from a refractive index of the second dielectric layer, and the refractive index of the second dielectric layer is different from a refractive index of the third dielectric layer;
   wherein the first dielectric layer and the third dielectric layer are silicon nitride layers, the second dielectric layer is an amorphous silicon layer, a thickness of the first dielectric layer is 640-660 angstroms, a thickness of the second dielectric layer is 160-180 angstroms, and a thickness of the third dielectric layer is 600-1200 angstroms;
   wherein the array substrate further comprises an indium tin oxide layer disposed on the passivation layer, the indium tin oxide layer and the array layer are located on opposite sides of the passivation layer; and the indium tin oxide layer is bonded to a chip in the array layer through a through hole defined on the passivation layer, all portions of the indium tin oxide layer are arranged around the lateral sides of the light-emitting components, and a thickness of the indium tin oxide layer is 480-520 angstroms.

2. The array substrate of claim 1, wherein the passivation layer further comprises a fourth dielectric layer, the fourth dielectric layer is formed on a side of the third dielectric layer away from the array layer.

3. The array substrate of claim 2, wherein a thickness of the first dielectric layer is 2400-2500 angstroms, a thickness of the second dielectric layer is 235-255 angstroms, and a thickness of the third dielectric layer is 1050-1080 angstroms, and a thickness of the fourth dielectric layer is 190-220 angstroms.

4. The array substrate of claim 1, wherein the through hole is defined and surrounded by an inner surface having a slope angle of 18°-87°.

5. The array substrate of claim 1, wherein the light-emitting components are submillimeter light-emitting diodes or miniature light-emitting diodes.

6. A display device, wherein the display device comprises an array substrate, the array substrate comprises a base substrate, an array layer, a passivation layer and light-emitting components;
the array layer is disposed over the base substrate and comprises a plurality of thin film transistors arranged in an array, the light-emitting components are disposed on one side of the array layer facing away from the base substrate; and
the passivation layer is disposed on the side of the array layer facing away from the base substrate, all portions of the passivation layer are arranged around lateral sides of the light-emitting components, and there is no part of the passivation layer over or below the light-emitting components, so that the passivation layer is reused as a reflective layer to directly reflect lateral light emitted from the light-emitting components, the passivation layer comprises a first dielectric layer, a second dielectric layer and a third dielectric layer stacked in sequence, the first dielectric layer is disposed close to the array layer, the third dielectric layer is disposed away from the array layer, a refractive index of the first dielectric layer is different from a refractive index of the second dielectric layer, and the refractive index of the second dielectric layer is different from a refractive index of the third dielectric layer;
wherein the first dielectric layer and the third dielectric layer are silicon nitride layers, the second dielectric layer is an amorphous silicon layer, a thickness of the first dielectric layer is 640-660 angstroms, a thickness of the second dielectric layer is 160-180 angstroms, and a thickness of the third dielectric layer is 600-1200 angstroms;
wherein the array substrate further comprises an indium tin oxide layer disposed on the passivation layer, the indium tin oxide layer and the array layer are located on opposite sides of the passivation layer; and the indium tin oxide layer is bonded to a chip in the array layer through a through hole defined on the passivation layer, all portions of the indium tin oxide layer are arranged around the lateral sides of the light-emitting components, and a thickness of the indium tin oxide layer is 480-520 angstroms.

7. The display device of claim 6, wherein the passivation layer further comprises a fourth dielectric layer, the fourth dielectric layer is formed on a side of the third dielectric layer away from the array layer.

8. The display device of claim 7, wherein a thickness of the first dielectric layer is 2400-2500 angstroms, a thickness of the second dielectric layer is 235-255 angstroms, and a thickness of the third dielectric layer is 1050-1080 angstroms, a thickness of the fourth dielectric layer is 190-220 angstroms.

9. The display device of claim 6, wherein the through hole is defined and surrounded by an inner surface, and a slope angle of the inner surface is 18°-87°.

10. The display device of claim 6, wherein the light-emitting components are submillimeter light-emitting diodes or miniature light-emitting diodes.

11. An array substrate, comprising:
a base substrate;
an array layer, disposed over the base substrate and comprising a plurality of thin film transistors arranged in an array;
light-emitting components, disposed on one side of the array layer facing away from the base substrate; and
a passivation layer, disposed on the side of the array layer facing away from the base substrate, wherein all portions of the passivation layer are arranged around lateral sides of the light-emitting components, and there is no part of the passivation layer over or below the light-emitting components, so that the passivation layer is reused as a reflective layer to directly reflect lateral light emitted from the light-emitting components,
wherein the passivation layer comprises a plurality of dielectric layers stacked on the array layer, a number of the plurality of dielectric layers is three or more than three, and refractive indexes of any two adjacent ones of the plurality of dielectric layers are different; and
wherein the array substrate further comprises an indium tin oxide layer disposed on the passivation layer, the indium tin oxide layer and the array layer are located on opposite sides of the passivation layer; and the indium tin oxide layer is bonded to a chip in the array layer through a through hole defined on the passivation layer, all portions of the indium tin oxide layer are arranged around the lateral sides of the light-emitting components, and a thickness of the indium tin oxide layer is 480-520 angstroms.

12. The array substrate of claim 11, wherein the plurality of dielectric layers comprise a silicon nitride layer having a thickness of 2400 angstroms, an amorphous silicon layer having a thickness of thickness 240 angstroms, a silicon oxide layer having a thickness of thickness 1080 angstroms, and an amorphous silicon layer having a thickness of thickness is 210 angstroms disposed and stacked in sequence on the array layer.

13. The array substrate of claim 11, wherein the plurality of dielectric layers comprise a silicon nitride layer having a thickness of 2420 angstroms, an amorphous silicon layer having a thickness of 250 angstroms, a silicon oxide layer having a thickness of 1060 angstroms, an amorphous silicon layer having a thickness of 200 angstroms, and a silicon oxide layer having a thickness of 760 angstroms disposed and stacked in sequence on the array layer.

14. The array substrate of claim 11, wherein the plurality of dielectric layers comprise a silicon nitride layer having a thickness of 2400 angstroms, an indium tin oxide layer having a thickness of 500 angstroms, a silicon oxide layer having a thickness of 750 angstroms, an amorphous silicon layer having a thickness of 250 angstroms, a silicon oxide layer having a thickness of 1050 angstroms, and an amorphous silicon layer having a thickness of 196 angstroms disposed and stacked in sequence on the array layer.

15. The array substrate of claim 11, wherein the plurality of dielectric layers comprise a silicon nitride layer having a thickness of 658 angstroms, an amorphous silicon layer having a thickness of 170 angstroms, and a silicon nitride layer having a thickness of 1200 angstroms disposed and stacked in sequence on the array layer.

16. The array substrate of claim 11, wherein the plurality of dielectric layers comprise a silicon nitride layer having a thickness of 650 angstroms, an amorphous silicon layer having a thickness of 178 angstroms, and a silicon nitride layer having a thickness of 600 angstroms disposed and stacked in sequence on the array layer.

\* \* \* \* \*